(12) United States Patent
Takada

(10) Patent No.: US 8,073,661 B2
(45) Date of Patent: Dec. 6, 2011

(54) SHAPE PREDICTION SIMULATOR, METHOD AND PROGRAM

(75) Inventor: Yorio Takada, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 413 days.

(21) Appl. No.: 12/326,575

(22) Filed: Dec. 2, 2008

(65) Prior Publication Data

US 2009/0144040 A1   Jun. 4, 2009

(30) Foreign Application Priority Data

Dec. 3, 2007   (JP) ................................. 2007-312470

(51) Int. Cl.
   *G06F 17/10*   (2006.01)
(52) U.S. Cl. ........................................... 703/2; 709/201
(58) Field of Classification Search ................ 703/6, 13, 703/2; 709/201, 202, 205
   See application file for complete search history.

(56) References Cited

U.S. PATENT DOCUMENTS

| | | | | |
|---|---|---|---|---|
| 6,044,213 | A * | 3/2000 | Akiyama ......................... | 703/13 |
| 7,108,580 | B2 * | 9/2006 | Ushio et al. ....................... | 451/8 |
| 7,216,320 | B2 * | 5/2007 | Chang et al. .................... | 716/113 |
| 7,360,191 | B2 * | 4/2008 | Chang et al. .................... | 716/102 |
| 7,549,143 | B2 * | 6/2009 | Alvarez-Gomariz et al. .. | 716/51 |
| 7,648,809 | B2 * | 1/2010 | Nakasugi .......................... | 430/30 |
| 7,686,673 | B2 * | 3/2010 | Senga et al. ....................... | 451/5 |
| 7,716,628 | B2 * | 5/2010 | Tanaka et al. .................... | 716/50 |
| 2004/0248411 | A1 * | 12/2004 | Ushio et al. ..................... | 438/689 |
| 2010/0233937 | A1 * | 9/2010 | Senga et al. ....................... | 451/5 |

FOREIGN PATENT DOCUMENTS

| | | |
|---|---|---|
| JP | 09-008038 A | 1/1997 |
| JP | 3334796 B2 | 8/2002 |
| JP | 2003-282495 A | 10/2003 |

* cited by examiner

*Primary Examiner* — Russell Frejd

(74) *Attorney, Agent, or Firm* — Sughrue Mion, PLLC

(57) ABSTRACT

An overlap amount definition section defines an amount of overlap between divided regions when a shape prediction objective region in a polished surface formed by chemical mechanical polishing is divided into a plurality of regions. A shape prediction computation processing section divides the objective region into the plurality of regions each of which includes a region corresponding to the overlap amount defined by the overlap amount definition section, and performs computation for shape prediction on each divided region by distributed processing. A merging processing section combines the results of shape prediction on the divided regions that are calculated by the shape prediction computation processing section.

9 Claims, 12 Drawing Sheets

SHAPE PREDICTION SIMULATOR, METHOD AND PROGRAM

BACKGROUND OF THE INVENTION (1) Field of the Invention

The present invention relates to a polishing technique and, more particularly, to a shape prediction simulator technique for predicting the shape of a polished surface formed by chemical mechanical polishing (CMP).

(2) Description of Related Art

CMP processes are being put to greater use as a flattening technique and a wiring forming technique for semiconductor devices (see Japanese Patent Laid-Open No. 2003-282495). Also, shape prediction simulator techniques for predicting a flattened shape or a wiring forming shape in a CMP process are being established in recent years.

The operation of a CMP shape prediction simulator will be described as an art related to the present invention.

Referring to FIG. 1, conditions for computation of the pattern density in a semiconductor device are set (step S10). In this pattern density computation condition setting, an analysis area on which a shape prediction is to be made is designated on the basis of layout data (a design drawing) which is information on the design of the semiconductor device, and a computation resolution is determined. The whole or part of the design drawing can be designated as the analysis area.

Subsequently, the pattern density in the designated analysis area is extracted. For this pattern density extraction processing, high-efficiency computation processing can be performed by using distributed processing, because there is no need to consider the influence from adjacent device patterns. In the example shown in FIG. 1, local processing in step S11 or distributed processing in step S12 is performed as pattern density extraction processing.

In local processing, as shown in FIG. 2, one processor (central processing unit (CPU)) performs processing for computing the pattern density in the entire objective region on which computation processing is to be performed. The CPU divides the entire objective region into a plurality of regions in grid form and computes the pattern density in each divided region. For a grid division, the grid size is determined by the computation resolution.

On the other hand, in distributed processing, as shown in FIG. 3, the region on which computation processing is to be performed is divided into four regions, and the divided regions are respectively assigned to four processors (CPUs). Each CPU divides the assigned region into a plurality of regions in grid form and computes the pattern density in each divided region.

After pattern density computation processing in step S11 or S12 is performed, process conditions are set. In this process condition setting, process conditions such as a model selection and a processing time for making a shape prediction are set (step S13). Shape prediction computation is then performed (step S14) according to the computation resolution set in step S10, the pattern densities extracted in step S11 or S12 and the process conditions set in step S13, and hot spot analysis is thereafter performed (step S15).

The inventor of the present invention recognized a problem described below with the CMP shape prediction simulator described above as a related art.

In a CMP process, polishing is performed by using physical contact among a pattern of a device, a polishing pad and slurry (abrasive grains) and, therefore, the shape of the polished device depends largely on the device pattern density. The shape formed by polishing is also influenced by an adjacent device pattern.

FIG. 4 shows the results of comparison between a case where shape prediction computation processing is performed by one CPU (local processing) and a case where shape prediction computation processing is performed by four CPUs (distributed processing). In a section on the left-hand side of FIG. 4, an example of local processing and an example of distributed processing are shown together with objective figures on which the processing is performed. On the right-hand side, a graph is shown which shows the results of shape prediction by local processing and distributed processing and values actually measured. The objective figure on which local processing is performed and the objective figure on which distributed processing is performed are identical to each other. In the graph, the ordinate represents the height of a polished portion and the abscissa represents the range of analysis (scan length). In the graph, the thickest line indicates variations in height of a polished portion in a-a' of the objective figure on which local processing is performed, and the second thickest line indicates variations in height of a polished portion in b-b' of the objective figure on which distributed processing is performed. The thinnest line indicates the actually measured values of the actually polished portion.

The computation processing time in the case of local processing is 6720 seconds, while the computation processing time in the case of distributed processing is 1700 seconds. Speed-up by about four times can be achieved by applying distributed processing to shape prediction computation processing. However, this distributed processing is processing in which computation is performed by simply dividing an analysis area into four, such that shape prediction is not performed by considering the influence of device pattern elements extending across the figure boundaries and the influence of device pattern elements in the vicinity of the boundaries. As a result, when distributed processing is used, the difference between the prediction result and the actually measured value is increased in the vicinity of the figure boundary portion (b-b') to considerably reduce the shape prediction accuracy, as shown in the graph of FIG. 4.

For this reason, local processing is applied to shape prediction computation processing in the above-described CMP shape prediction simulator. Therefore, a considerably long time is required for shape prediction computation processing, depending on conditions including the analysis area and the computation resolution.

SUMMARY

The present invention seeks to solve one or more of the above problems, or to improve upon those problems at least in part.

According to one aspect of the present invention, there is provided a device which predicts a shape of a polished surface formed by chemical mechanical polishing, the device including an overlap amount definition section which defines an amount of overlap between divided regions when a shape prediction objective region is divided into a plurality of regions, a shape prediction computation processing section which divides the objective region into the plurality of regions each of which includes a region corresponding to the overlap amount defined by the overlap amount definition section, and which performs computation for shape prediction on each divided region by distributed processing, and a merging processing section which combines the results of shape prediction on the divided regions computed by the shape prediction computation processing section.

There is also provided a method of predicting a shape of a polished surface formed by chemical mechanical polishing, the method including defining an amount of overlap between divided regions when a shape prediction objective region is divided into a plurality of regions, dividing the objective region into the plurality of regions each of which includes a region corresponding to the defined overlap amount, performing computation for shape prediction on each divided region by distributed processing, and combining the results of shape prediction on the divided regions computed.

There is further provided a program for making a computer comprising a plurality of processors execute prediction of a shape of a polished surface formed by chemical mechanical polishing, the program making the computer execute first processing for reading out an objective region on which the shape prediction is to be made, second processing for dividing the read objective region into a plurality of individual regions, third processing for forming a plurality of divided data groups by expanding boundaries of the plurality of individual regions by a predetermined amount, fourth processing for distributing the plurality of divided data groups to the plurality of processors and for making the shape prediction in each of the plurality of processors, and fifth processing for merging the results of shape prediction in the plurality of processors.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the invention and that the invention is not limited to the embodiments illustrated herein for explanatory purposes.

Figure 5:
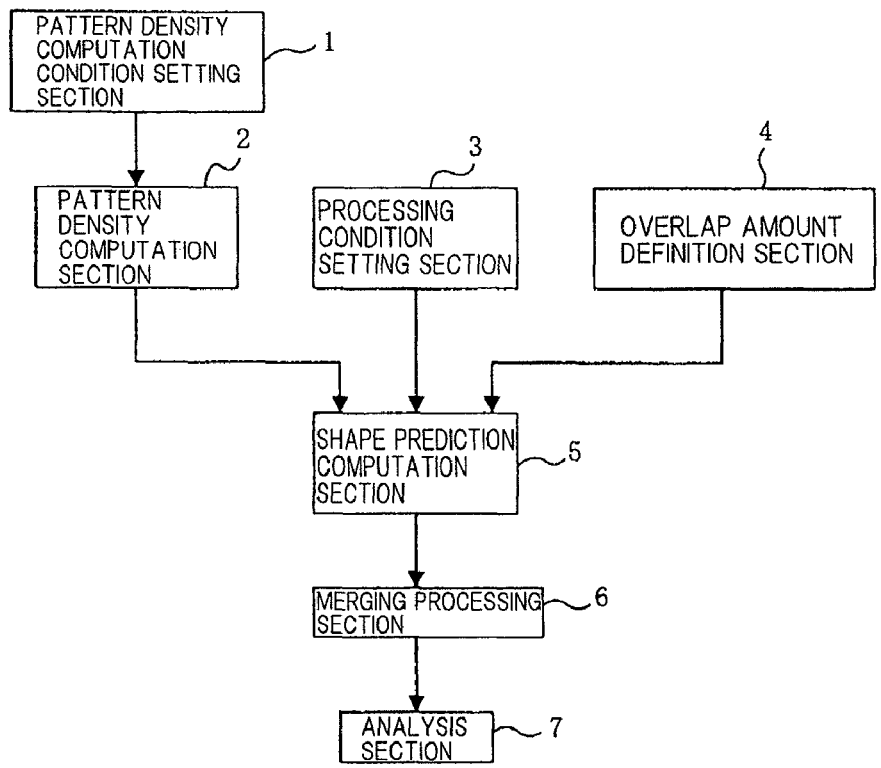
FIG. 5 is a block diagram showing a configuration of CMP shape prediction simulator which is a first embodiment.

Referring to FIG. 5, a CMP shape prediction simulator, according to a first embodiment in which a computer system is constituted, includes: pattern density computation condition setting section 1, pattern density computation section 2, processing condition setting section 3, overlap amount definition section 4, shape prediction computation section 5, merging processing section 6 and analysis section 7. The computer system is constituted by a storage device for storing a program, etc., an input device such as a keyboard or a mouse, a display device such as a liquid crystal display (LCD), a communication device such as a modem for performing communication with an external device, an output device such as a printer, and a controller which operates in accordance with a program stored in the storage device and which controls the operations of the communication device, the output device and the display device while accepting inputs from the input device.

Pattern density computation condition setting section 1 sets conditions for computation of the pattern density in a semiconductor device to be polished. In this pattern density computation condition setting, pattern density computation condition setting section 1 displays, on the display device, layout data (a design drawing) which is information on the design of the semiconductor device. A simulator operator designates, by means of the input device, an analysis area on which a shape prediction is to be made by referring to the displayed layout data, and sets a computation resolution. As the analysis area, the whole or part of the design drawing can be designated. These input information items (the analysis area and the computation resolution) are supplied as computation conditions from pattern density computation condition setting section 1 to pattern density computation section 2.

Figure 1:
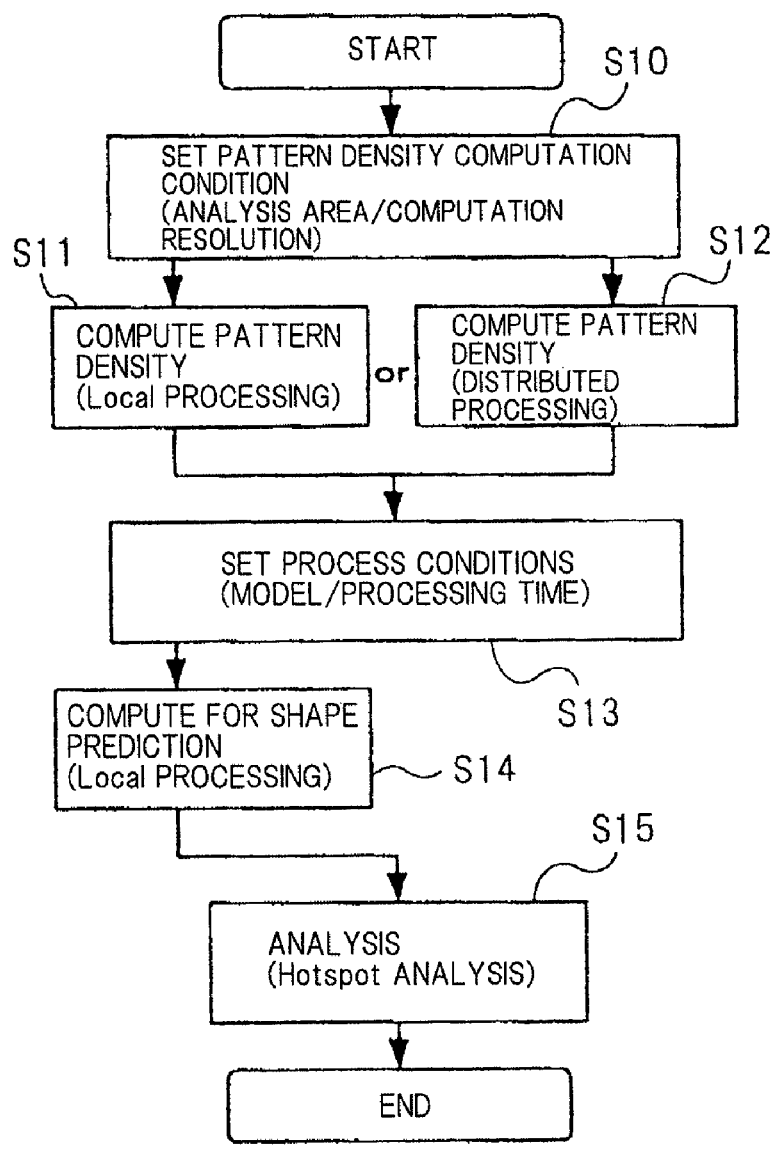
FIG. 1 is a flowchart showing the operation of a CMP shape prediction simulator as a related art.
Figure 2:
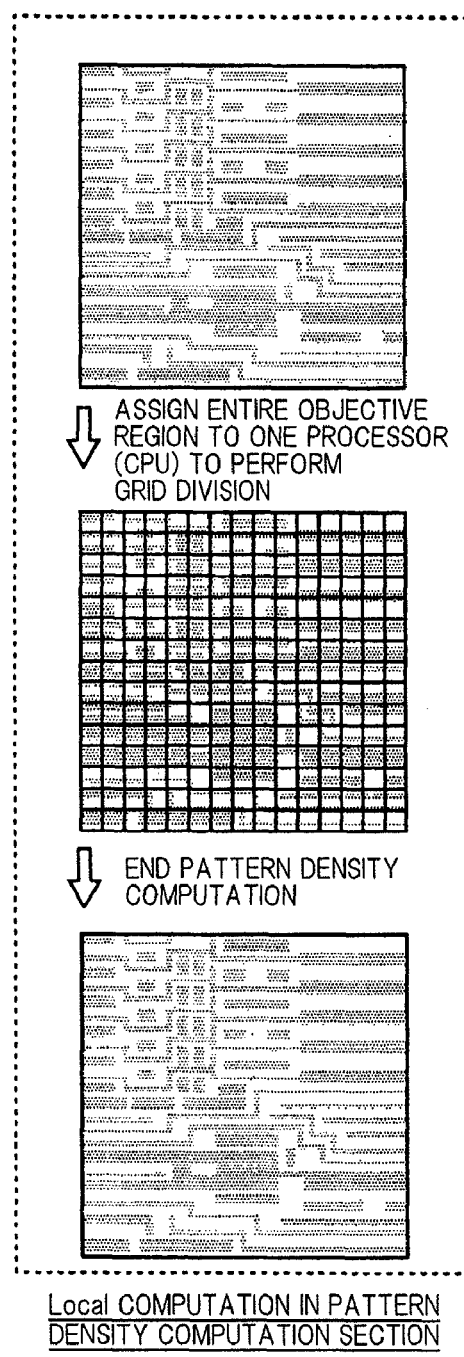
FIG. 2 is a schematic diagram showing an example of local processing for pattern density computation performed in the CMP shape prediction simulator shown in FIG. 1.
Figure 3:
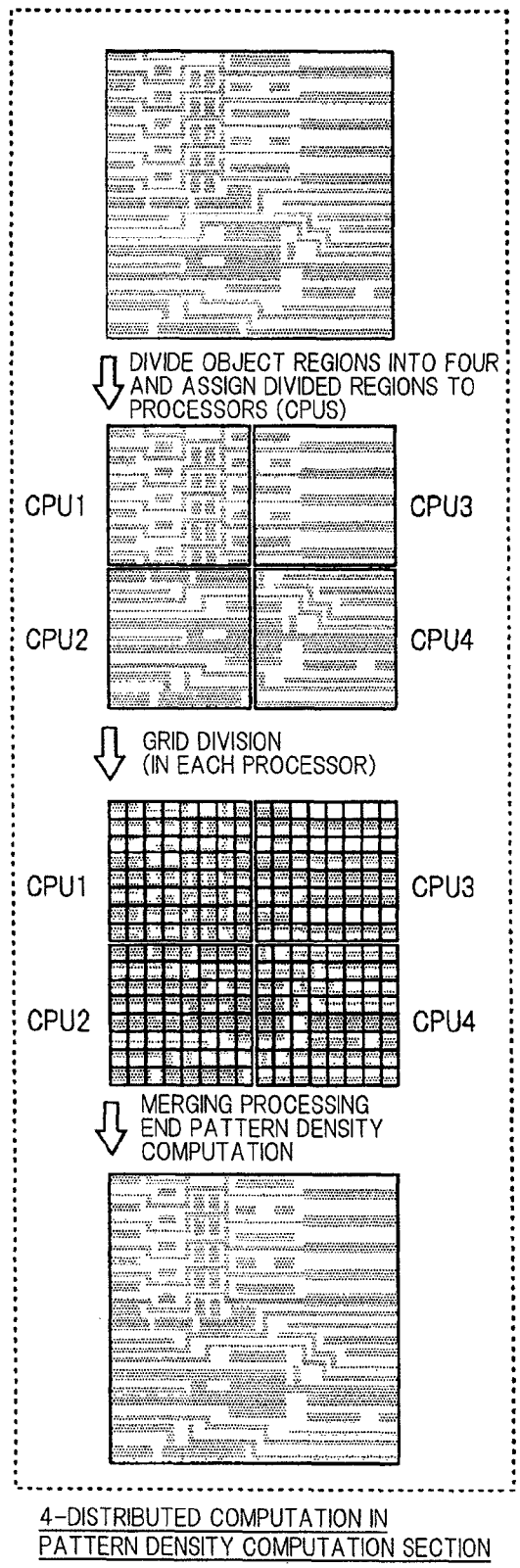
FIG. 3 is a schematic diagram showing an example of distributed processing for pattern density computation performed in the CMP shape prediction simulator shown in FIG. 1.

Pattern density computation section 2 extracts the pattern density in the designated analysis area on the basis of the computation conditions supplied from pattern density computation condition setting section 1. To this pattern density extraction processing, either of two processes, i.e., local processing in which computation processing is performed by one CPU (see step S11 in FIG. 1) and distributed processing in which computation processing is performed by a plurality of CPUs (see step S12 in FIG. 1), is applied. The simulator operator performs a predetermined input operation on the input device to select local processing or distributed processing. When distributed processing is applied to pattern density extraction processing, high-efficiency computation processing can be performed. Pattern density extraction results are supplied from pattern density computation section 2 to shape prediction computation section 5.

Processing condition setting section 3 sets process conditions such as a model selection and a processing time for making a shape prediction. A model is formed (as an equation) so as to have polishing characteristics (polishing behaviors) with respect to conditions such as the pattern density and the wiring line width. For processes that represent a concern, models that are formed with certain polishing characteristics are stored in advance in tools on a process-by-process basis. Processing condition setting section 3 displays tool information on the display device, and the simulator operator designates the model for making a shape prediction from the displayed tool information by means of the input device. The simulator operator also sets a processing time corresponding to a polishing time by means of the input device. These input information items (the selected model and the set processing time) are supplied as process conditions from processing condition setting section 3 to shape prediction computation section 5.

Overlap amount definition section 4 defines the amount of overlap between divided regions when a shape prediction objective region is divided into these regions. More specifically, overlap amount definition section 4 forms a function that represents the range of effects that is caused when a pattern is polished. Overlap amount definition section 4 defines, as an overlap amount, the half-width of a graph which shows, at the time of polishing, changes in pressure in the range of effects. The range of effects is dependent on the characteristics of a member used in chemical mechanical polishing. The graph is obtained based on a function of the range of effects. Still more specifically, an overlap amount is determined on the basis of a characteristic diagram (graph) which is obtained from film thickness data and sectional shapes when the semiconductor device is actually polished under the "process conditions and member configuration" for the objective process, and the diagram is formed as a function that represents the range of effects that is caused by polishing the pattern. The member configuration means a member such as a polishing pad used in the CMP process.

Figure 6:
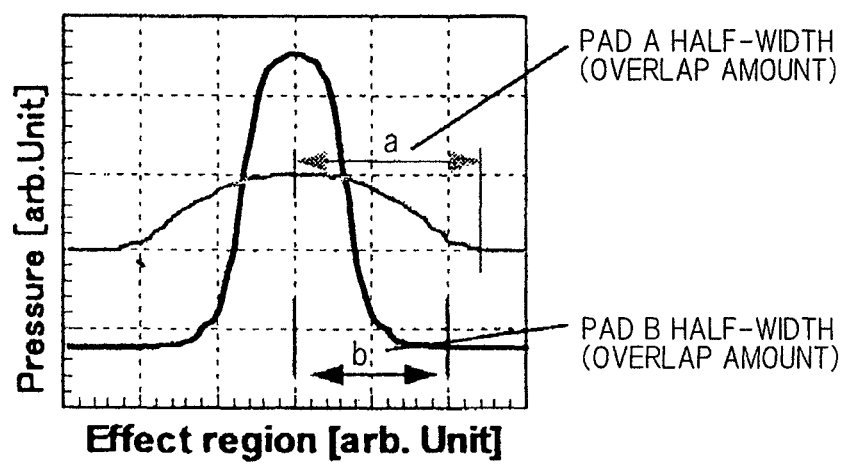
FIG. 6 is a diagram showing a graph formed as a function that represents the range of effects that is caused when a pattern are polished with respect to two pads differing in hardness from each other.

FIG. 6 shows, with respect to two pads differing in hardness, a graph formed as a function that represents the range of effects that is caused by polishing on the pattern when the semiconductor device is polished. The hardness of pad A in the two pads is smaller than that of the other pad B. In the graph shown in FIG. 6, the ordinate represents pressure and the abscissa represents an effect region. The effect region represents a region in which the pressure is changed. The effect region that is obtained when a pattern is polished with pad A is larger than the effect region that is obtained when a pattern is polished with pad B. In the case of polishing with pad A, the half-width a of the effect region is defined as an overlap amount. In the case of polishing with pad B, the half-width b of the effect region is defined as an overlap amount. By defining the necessary minimum overlap amount in this way, the increase in computation processing time that occurs with an increase in overlap amount can be minimized. The overlap amount (half-width) is supplied from overlap amount definition section 4 to shape prediction computation section 5.

Shape prediction computation section 5 performs computation processing for shape prediction in the case of polishing the semiconductor device on the basis of the pattern density extraction results supplied from pattern density computation section 2, the process conditions supplied from processing condition setting section 3 and the overlap amount (half-width) supplied from overlap amount definition section 4. In this shape prediction computation processing, the shape prediction objective region (objective figure) is divided into a plurality of regions in such a form that the overlap amount defined by the half-widths is added thereto. The divided regions are respectively assigned to the independent CPUs. Each CPU divides the assigned region into a plurality of regions in grid form and performs shape prediction computation processing on each divided region.

Figure 7:
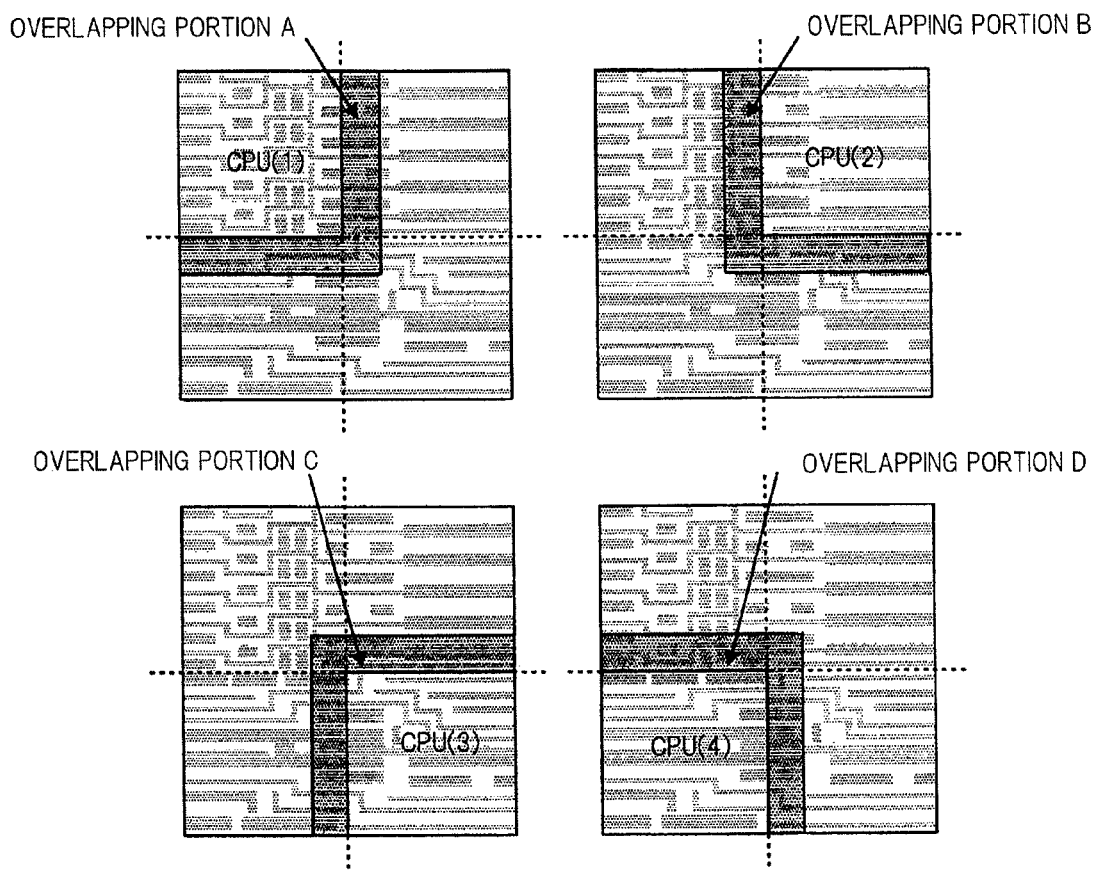
FIG. 7 is a schematic diagram showing divided regions assigned to CPUs in a case where a shape prediction objective region is divided into four to perform distributed processing.

FIG. 7 schematically shows divided regions assigned to the CPUs in a case where distributed processing is performed by dividing the region set as an object on which computation processing is to be performed (shape prediction objective region) into four. In the example shown in FIG. 7, the region set as an object on which computation processing is to be performed is divided into first to the fourth divided regions.

To the boundaries of the first divided region on the other divided regions, an overlapping portion A having a width corresponding to the overlap amount (half-width) supplied from overlap amount definition section 4 is added. The first divided region including the overlapping portion A is assigned to the first CPU (1).

To the boundaries of the second divided region on the other divided regions, an overlapping portion B having a width corresponding to the overlap amount (half-width) supplied from overlap amount definition section 4 is added. The second divided region including the overlapping portion B is assigned to the second CPU (2).

To the boundaries of the third divided region on the other divided regions, an overlapping portion C having a width corresponding to the overlap amount (half-width) supplied from overlap amount definition section 4 is added. The third divided region including the overlapping portion C is assigned to the third CPU (3).

To the boundaries of the fourth divided region on the other divided regions, an overlapping portion D having a width corresponding to the overlap amount (half-width) supplied from overlap amount definition section 4 is added. The fourth divided region including the overlapping portion D is assigned to the fourth CPU (4).

In shape prediction computation section 5, each of the first to fourth CPUs divides the assigned region into a plurality of regions in grid form and performs shape prediction computation processing on each divided region.

There is a possibility of a mismatch between the border of one of the divided regions to which the overlap amount defined by the half-width is added and a grid line based on the computation resolution (grid size) defined by the above-described pattern density computation condition setting.

Figure 8A:
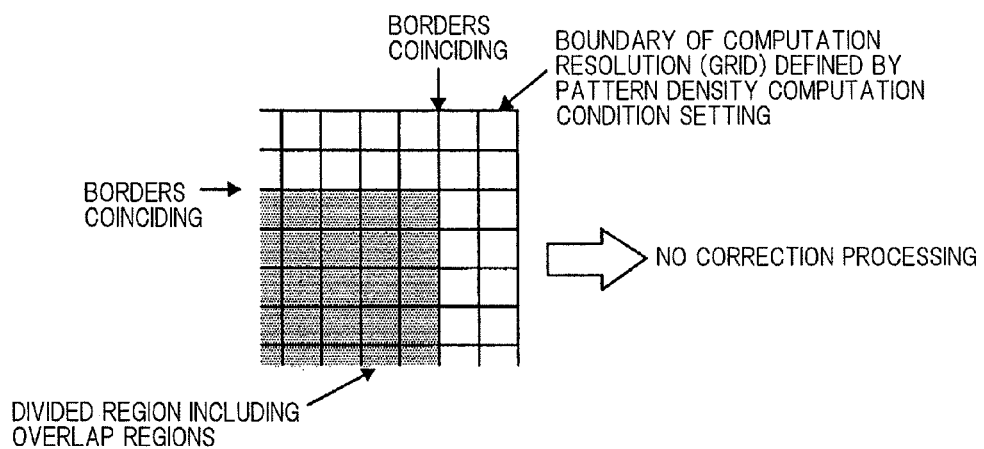
FIG. 8A is a schematic diagram showing an example of a case where borders of one of the divided regions to which an overlap amount is added coincide with grid lines.

FIG. 8A schematically shows an example of a case where borders of one of the divided regions to which the overlap amount is added coincide with grid lines. In a case where, as in this example, borders of one of the divided regions to which the overlap amount is added coincides with grid lines, processing for expanding the divided region is not performed by shape prediction computation section 5.

Figure 8B:
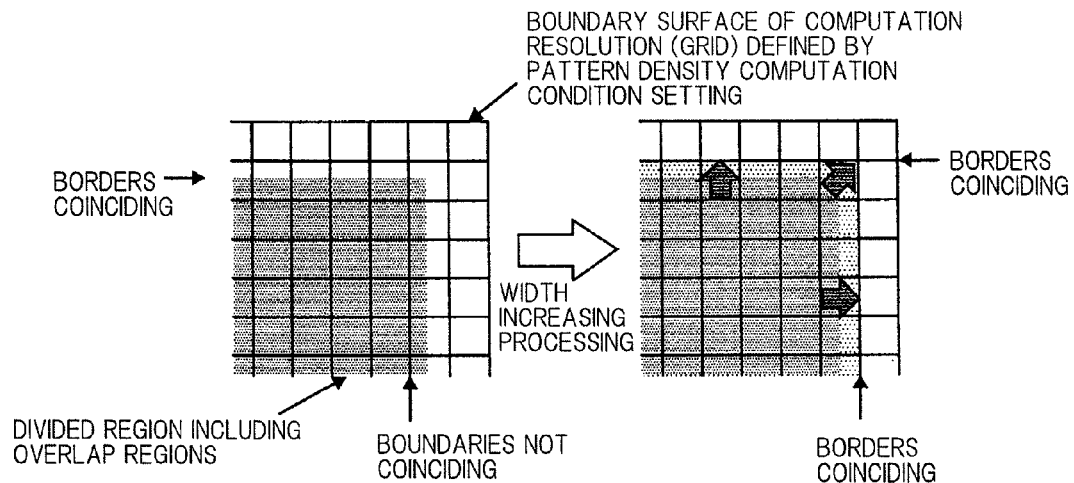
FIG. 8B is a schematic diagram showing an example of a case where the borders of one of the divided regions to which the overlap amount is added do not coincide with grid lines.

FIG. 8B schematically shows an example of a case where borders of one of the divided regions to which the overlap amount is added do not coincide with grid lines. In each of the X-axis (abscissa) direction and the Y-axis (ordinate) direction, borders of the region to which the overlap amount is added do not coincide with the grid line. In this case, shape prediction computation section 5 performs processing for further expanding the divided region to which the overlap amount is added in each of the X-axis and Y-axis directions. The borders of the expanded region coincide with the grid lines. In a case where a mismatch occurs only in the X-axis direction, expansion processing with respect to the X-axis direction is performed. Similarly, in a case where a mismatch occurs only in the Y-axis direction, expansion processing with respect to the Y-axis direction is performed.

Merging processing section 6 synthesizes a figure based on the results (predicted values) of shape prediction on the divided regions supplied from shape prediction computation section 5. The results (predicted values) of shape prediction on the overlapping regions become unnecessary after merging processing. Therefore, merging processing section 6 removes the results (predicted values) of shape prediction on each overlapping region from the results (predicted values) of shape prediction on the corresponding divided region before performing figure synthesis. The merging processing results are supplied from merging processing section 6 to analysis section 7.

Analysis section 7 performs analysis processing on the basis of the merging processing results supplied from merging processing section 6. In this analysis processing, analysis of, for example, the film thickness in the designated analysis area is performed on the basis of the merging processing results.

A procedure for shape prediction processing by the CMP shape prediction simulator in the present embodiment will now be described.

Figure 9:
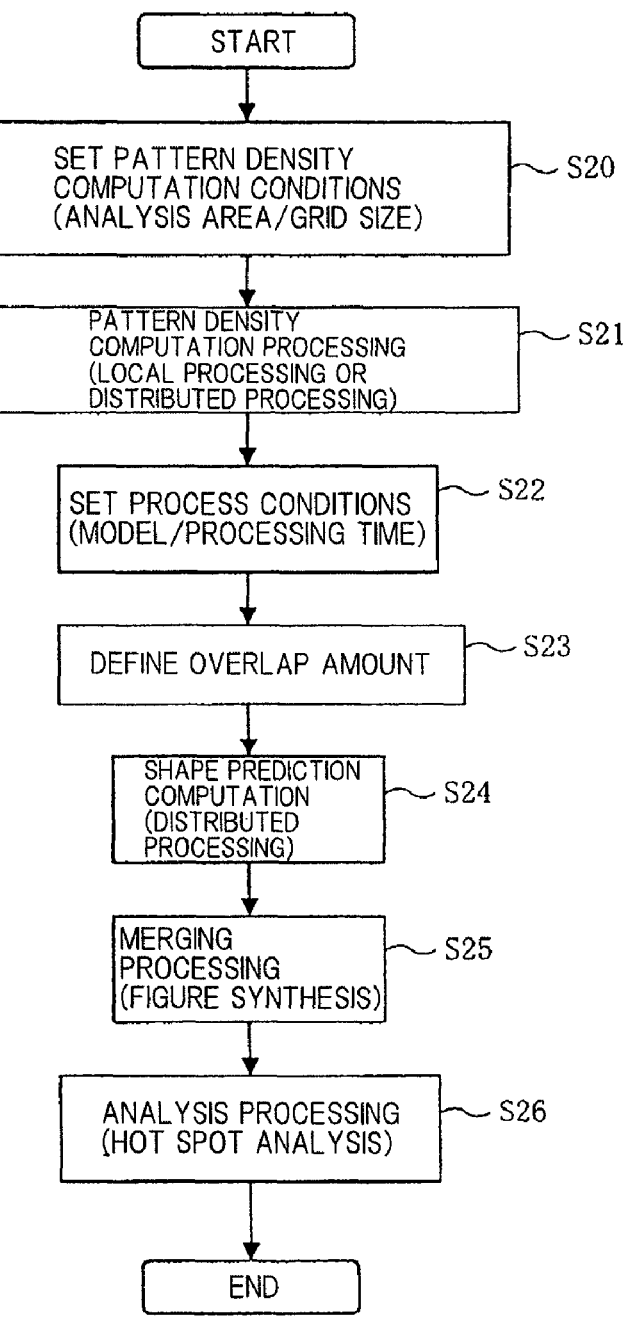
FIG. 9 is a flowchart showing an example of a procedure for shape prediction processing performed in the CMP shape prediction simulator shown in FIG. 5.

FIG. 9 shows an example of a shape prediction processing procedure. Referring to FIG. 9, pattern density computation condition setting section 1 first sets conditions for computation of the pattern density in a semiconductor device to be polished (step S20). Pattern density computation section 2 then extracts the pattern density in a designated analysis area on the basis of the computation conditions supplied from pattern density computation condition setting section 1 (step S21).

Subsequently, processing condition setting section 3 sets process conditions (step S22) and overlap amount definition section 4 defines an overlap amount (step S23). Shape prediction computation section 5 performs computation processing (distributed processing) (step S24) for predicting a shape in the case of polishing the semiconductor device on the basis of the pattern density extraction results extracted in step S21, the process conditions set in step S22 and the overlap amount (half-width) defined in step S23.

Subsequently, merging processing section 6 synthesizes a figure (step S25) based on the results (predicted values) of shape prediction on the divided regions obtained by distributed processing in step S24. Analysis section 7 thereafter performs analysis processing on the basis of the results of merging processing in step S25.

The processing (function) in each of the above-described constituent sections can be realized by the controller (CPU) executing a program stored in the storage device on the computer system constituting the CMP shape prediction simulator. The program may be stored in the storage device in advance. The program may alternatively be provided by means of a recording medium typified by a CD-ROM or a DVD. In the case of providing the program by means of a recording medium, a device for writing information to the recording medium and for reading information from the recording medium is provided in the CMP shape prediction simulator.

The program may alternatively be provided to the CMP shape prediction simulator via a network typified by the Internet. In such a case, a function to perform communication over the network is provided in the CMP shape prediction simulator.

In the above-described CMP shape prediction simulator in the present embodiment, distributed processing for shape prediction computation is performed in shape prediction computation section 5 and, therefore, computation processing can be performed at high speed.

Also, shape prediction computation performed by considering the influence of device pattern elements extending across the boundaries between divided regions and the influence of device pattern elements in the vicinity of the boundaries is enabled by causing the divided regions to overlap each other, thus realizing shape prediction computation with high accuracy.

Figure 10:
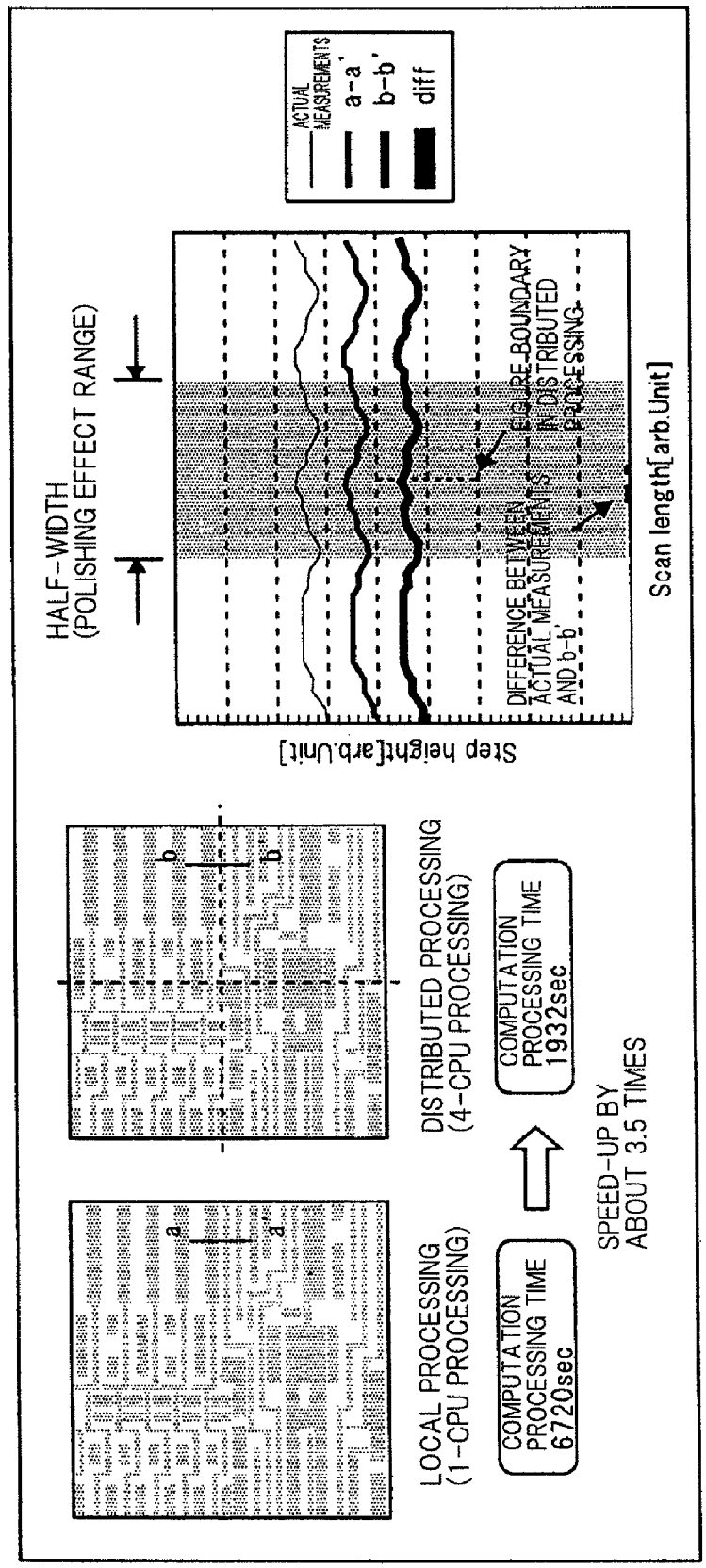
FIG. 10 is a schematic diagram showing the results of shape prediction computation processing (distributed processing) in the CMP shape prediction simulator in the first embodiment and the results of shape prediction computation processing (local processing) by one CPU referred to as a comparative example.

FIG. 10 shows the results of shape prediction computation processing (distributed processing) in the CMP shape prediction simulator in the present embodiment and the results of shape prediction computation processing (local processing) that are obtained by one CPU referred to as a comparative example. In a section on the left-hand side of FIG. 10, an example of local processing (the same as that shown in FIG. 4) and an example of distributed processing are shown together with figures on which the processing is performed. On the right-hand side, a graph is shown which shows the results of shape prediction by local processing and distributed processing and the values that were actually measured. The objective figure on which local processing is performed and the objective figure on which distributed processing is performed are identical to each other. In the graph, the ordinate represents the height of a polished portion and the abscissa represents the range of analysis (scan length). In the graph, the thickest line indicates variations in height of a polished portion in b-b' of the figure on which distributed processing is performed, and the second thickest line indicates variations in height of a polished portion in a-a' of the figure on which local processing is performed. The thinnest line indicates the actually measured values of the actually polished portion.

The computation processing time in the case of local processing is 6720 seconds, while the computation processing time in the case of distributed processing is 1932 seconds. Speed-up by about 3.5 times can be achieved by using distributed processing in comparison with local processing.

Figure 4:
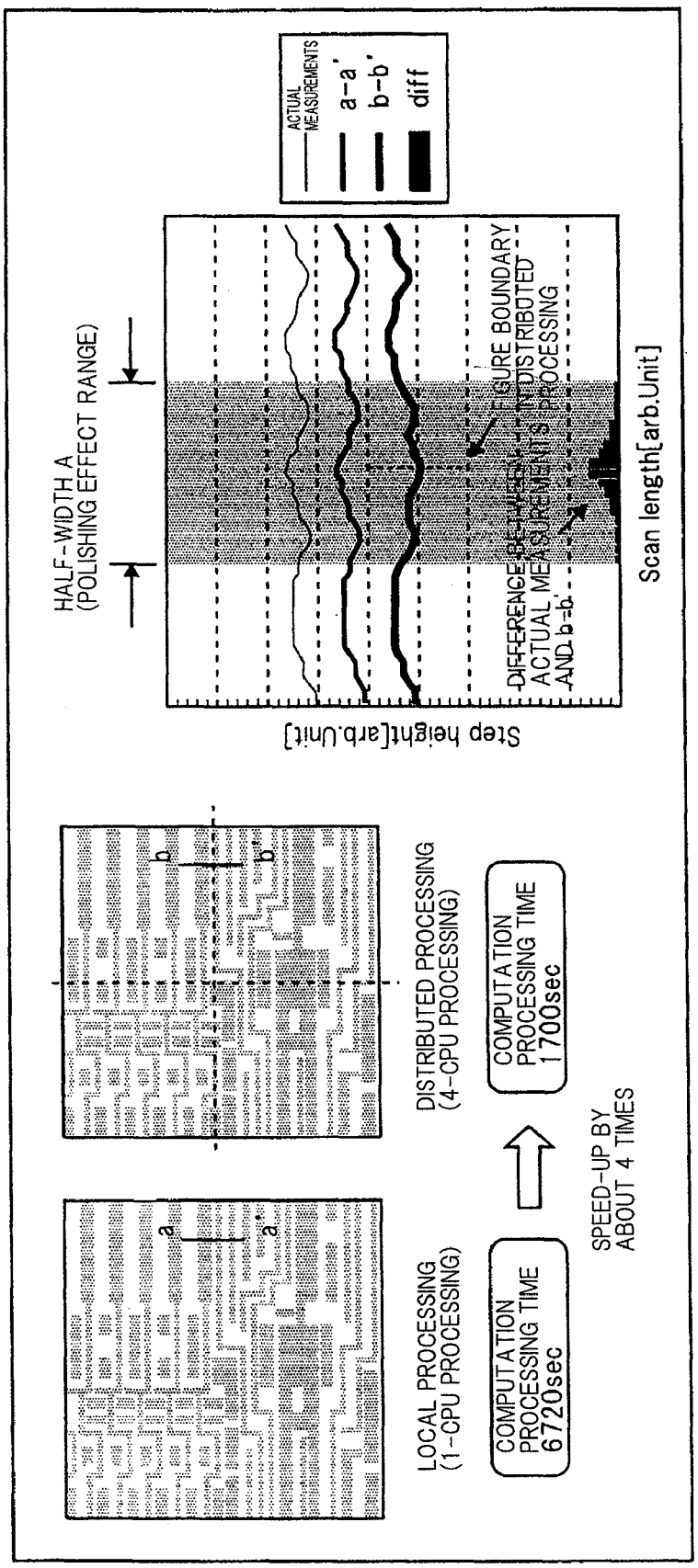
FIG. 4 is a schematic diagram showing the results of local processing and distributed processing applied to shape prediction computation performed in the CMP shape prediction simulator shown in FIG. 1.

Also, as can be understood from the graph of FIG. 10, the results of prediction by distributed processing are substantially the same as the actually measured values in the vicinity of the figure boundary (b-b'), and the shape prediction accuracy can be improved in comparison with distributed processing shown in FIG. 4.

The above-described CMP shape prediction simulator is an embodiment of the present invention. The configuration and the operation of the simulator can be changed as desired without departing from the gist of the invention.

For example, shape prediction computation processing section 5 may be configured so as to be capable of selecting between distributed processing and local processing. The simulator operator performs a predetermined input operation on the input device to select between local processing and distributed processing. Local processing is used for small-scale computation, while distributed processing is used for large-scale computation. Shape prediction computation processing can be performed with improved efficiency in this way.

Description will be made of the relationship between a program and hardware (computer) according to the present invention.

Figure 11:
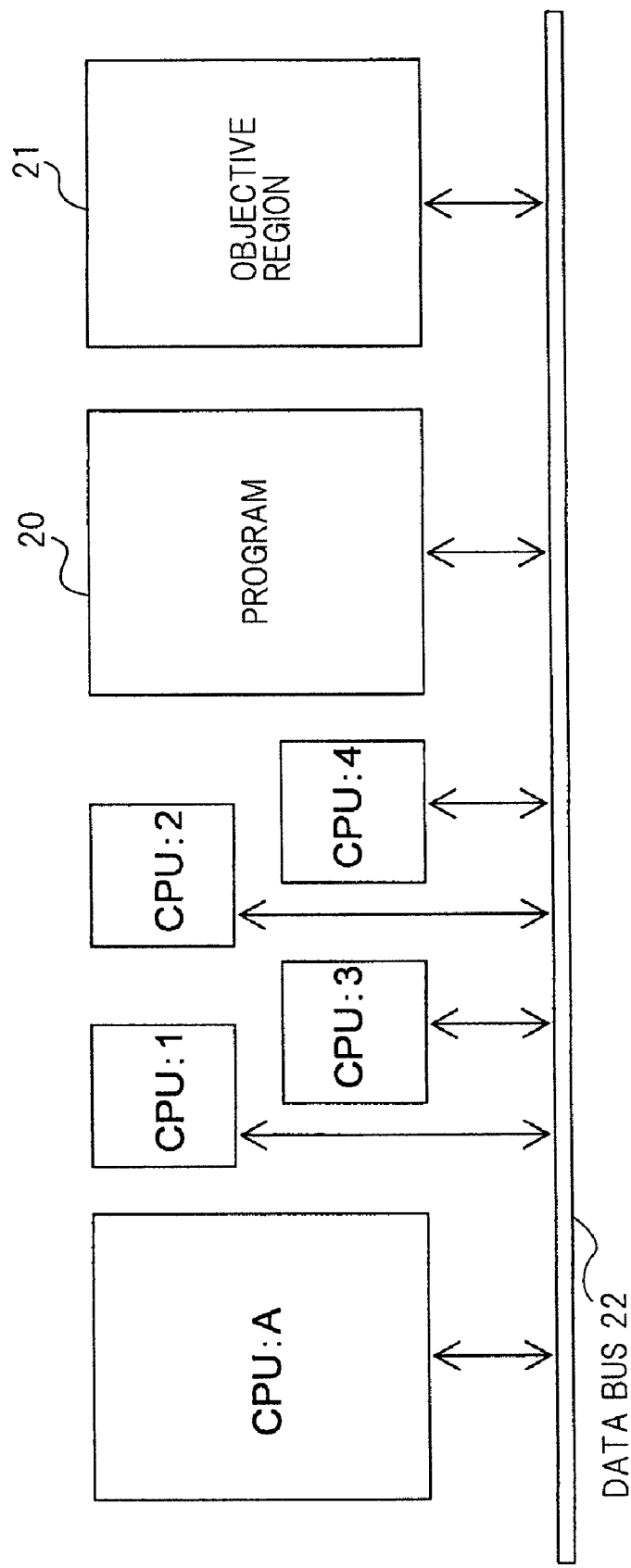
FIG. 11 is a diagram showing a relationship between a program and hardware (computer) according to the present invention.

As shown in FIG. 11, a CPU:A and CPUs:1 to 4 are respectively connected to data bus 22. Through data bus 22, the CPU:A can access a storage means in which program 20 and objective region 21 are stored. Program 20 makes the CPU:A execute first to fourth processings described below.

The CPU:A first reads data on objective region 21 from the storage means (first processing). Subsequently, the CPU:A divides the read data into portions of a predetermined size, and forms a plurality of divided data groups by adding data corresponding to the overlap amount set in advance to the divided data portions (second processing). Subsequently, the CPU:A assigns the plurality of divided data groups to the CPUs:1 to 4, and each of the CPUs:1 to 4 performs shape prediction processing (third processing).

While the number of CPUs which perform shape prediction processing is four in the present embodiment, the present invention is not limited to this. The number of CPUs may be smaller than four, or may be equal to or larger than five.

From the viewpoint of efficiently performing distributed processing by the CPUs, for assignment of divided data to CPUs:1 to 4, it is desirable to equalize the loads on the CPUs. More specifically, the numbers of data items in the divided data groups assigned to the CPUs are equalized. If the times for processing of the divided data groups are known in advance, the total lengths of time for processing in the CPUs are equalized.

After shape prediction processing in the CPUs:1 to 4 is performed, merging processing is performed on the results of shape predictions made by the CPUs (fourth processing). Since the overlapping portions are unnecessary at the time of merging, the overlapping portions are removed from the shape prediction results and merging processing is performed in this state.

As a result of the above-described first to fourth processing operations, the results of shape prediction on the objective region are output from the CPU:A.

Figure 12:
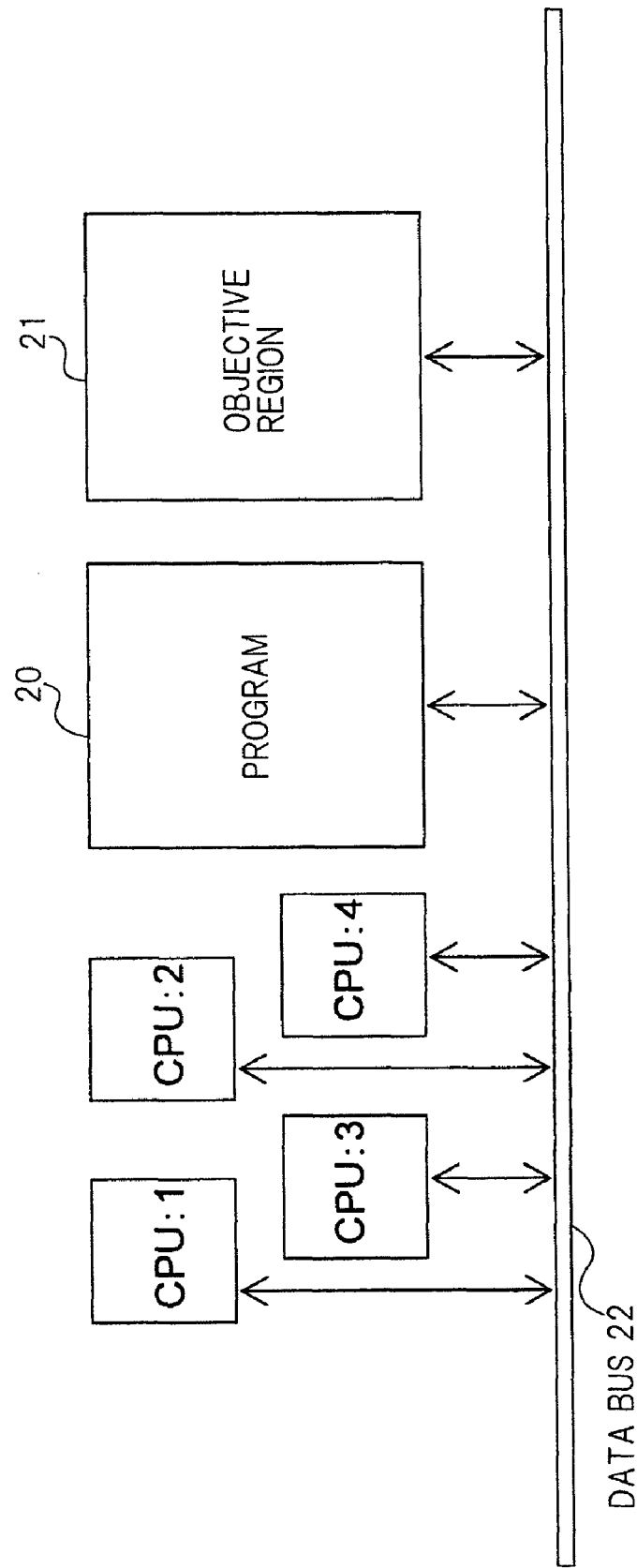
FIG. 12 is a diagram showing another relationship between a program and hardware (computer) according to the present invention.

The CPU:A may be removed, as shown in FIG. 12. In this case, one of the CPUs: 1 to 4 performs the first to fourth processing operations performed by CPU:A.

The present invention can be applied to semiconductor manufacturing techniques and also to all shape prediction systems (or all figure processing apparatuses) for predicting the shape of a polished surface formed by chemical mechanical polishing, regardless of whether the polished surface is nonmetallic or metal-film-based.

It is apparent that the present invention is not limited to the above embodiments, but may be modified and changed without departing from the scope and sprit of the invention.

What is claimed is:

1. A shape prediction simulator which predicts a shape of a polished surface formed by chemical mechanical polishing, the shape prediction simulator comprising:
   an overlap amount definition section which defines an amount of overlap between divided regions when a shape prediction objective region is divided into a plurality of regions;
   a shape prediction computation processing section, implemented by a processor, which divides the objective region into the plurality of regions each of which includes a region corresponding to the overlap amount defined by the overlap amount definition section, and which performs computation for shape prediction on each divided region by distributed processing; and
   a merging processing section which combines the results of shape prediction on the divided regions that are calculated by the shape prediction computation processing section.

2. The shape prediction simulator according to claim 1, wherein the objective region is a region in which a pattern of a semiconductor device is formed, and the overlap amount definition section forms a function which represents the range of effects that is caused when a pattern is polished, the range of effects being determined by characteristics of a member used in the chemical mechanical polishing, and the overlap amount definition section defines, as the overlap amount, the half-width of a graph which shows changes in pressure in the range of effects at the time of polishing and which is obtained based on a function of the range of effects.

3. The shape prediction simulator according to claim 2, wherein the characteristics of the member used in the chemical mechanical polishing are characteristics based on the hardness of a polishing pad.

4. The shape prediction simulator according to claim 1, wherein the shape prediction computation processing section determines, with respect to each of the plurality of divided regions including the regions corresponding to the overlap amount, whether or not borders of the divided region coincide with grid lines formed of a plurality of lines perpendicular to each other, and wherein, if a mismatch occurs between the borders of the divided region and the grid lines, the shape prediction computation processing section expands the divided region so that the borders coincide with the grid lines.

5. The shape prediction simulator according to claim 1, wherein the merging processing section deletes the results of shape prediction on the regions corresponding to the overlap amount from the results of shape prediction on the divided regions that are calculated by the shape prediction computation processing section.

6. A shape prediction method of predicting a shape of a polished surface formed by chemical mechanical polishing, the method comprising:
   defining an amount of overlap between divided regions when a shape prediction objective region is divided into a plurality of regions;
   dividing the objective region into the plurality of regions each of which includes a region corresponding to the defined overlap amount, and performing computation for shape prediction on each divided region by distributed processing; and
   combining the results of computed shape prediction on the divided regions.

7. A non-transitory computer readable medium having stored thereon a program for making a computer comprising a plurality of processors execute prediction of a shape of a polished surface formed by chemical mechanical polishing, the program making the computer execute:
   first processing for reading out an objective region on which the shape prediction is to be made;
   second processing for dividing the read objective region into a plurality of individual regions;
   third processing for forming a plurality of divided data groups by expanding boundaries of the plurality of individual regions by a predetermined amount;
   fourth processing for distributing the plurality of divided data groups to the plurality of processors and for making the shape prediction in each of the plurality of processors; and
   fifth processing for merging the results of shape prediction in the plurality of processors.

8. The shape prediction method according to claim 6, wherein the objective region includes a pattern of a semiconductor device, the amount of overlap representing the range of effects that is caused when the pattern is polished, the range of effects being determined by characteristics of a member used in the chemical mechanical polishing.

9. The shape prediction method according to claim 8, wherein the characteristic of the member used in the chemical mechanical polishing are based on hardness of a polishing pad.

* * * * *